United States Patent
Mazure et al.

(10) Patent No.: US 8,654,602 B2
(45) Date of Patent: *Feb. 18, 2014

(54) PSEUDO-INVERTER CIRCUIT ON SEOI

(75) Inventors: Carlos Mazure, Bernin (FR); Richard Ferrant, Esquibien (FR); Bich-Yen Nguyen, Austin, TX (US)

(73) Assignee: Soitec, Bernin (FR)

( * ) Notice: Subject to any disclaimer, the term of this patent is extended or adjusted under 35 U.S.C. 154(b) by 52 days.

This patent is subject to a terminal disclaimer.

(21) Appl. No.: 13/495,632

(22) Filed: Jun. 13, 2012

(65) Prior Publication Data

US 2012/0250444 A1    Oct. 4, 2012

Related U.S. Application Data

(63) Continuation of application No. 12/793,553, filed on Jun. 3, 2010, now Pat. No. 8,223,582.

(30) Foreign Application Priority Data

Apr. 2, 2010 (FR) ..................................... 10 52543

(51) Int. Cl.
 *G11C 8/00* (2006.01)
(52) U.S. Cl.
 USPC ................................. 365/230.08; 365/189.08
(58) Field of Classification Search
 USPC ........................................ 365/230.06, 189.08
 See application file for complete search history.

(56) References Cited

U.S. PATENT DOCUMENTS

| | | | |
|---|---|---|---|
| 4,169,233 A | 9/1979 | Haraszti | 307/355 |
| 5,028,810 A | 7/1991 | Castro et al. | 307/201 |
| 5,306,530 A | 4/1994 | Strongin et al. | 427/533 |
| 5,325,054 A | 6/1994 | Houston | 324/158 |

(Continued)

FOREIGN PATENT DOCUMENTS

| EP | 1 081 748 A2 | 3/2001 |
|---|---|---|
| EP | 1 095 407 A1 | 5/2001 |

(Continued)

OTHER PUBLICATIONS

Barth et al., "A 500MHz Random Cycle 1.5ns-Latency, SOI Embedded DRAM Macro Featuring a 3T Micro Sense Amplifier," IEEE International Solid-State Circuits Conference, 2007. ISSCC 2007. Digest of Technical Papers, pp. 486, 487 and 617 (Feb. 15, 2007).

(Continued)

*Primary Examiner* — Son Dinh
(74) *Attorney, Agent, or Firm* — Winston & Strawn LLP

(57) ABSTRACT

A circuit made on a semiconductor-on-insulator substrate. The circuit includes a first transistor having a first channel, a second transistor having a second channel, with the transistors provided in serial association between first and second terminals for applying a power supply potential, each of the transistors comprising a drain region and a source region in the thin layer, a channel extending between the source region and the drain region, and a front control gate located above the channel. Each transistor has a back control gate formed in the base substrate below the channel of the transistor and capable of being biased in order to modulate the threshold voltage of the transistor. At least one of the transistors is configured for operating in a depletion mode under the action of a back gate signal which will sufficiently modulate its threshold voltage.

14 Claims, 6 Drawing Sheets

(56) References Cited

U.S. PATENT DOCUMENTS

| | | | |
|---|---|---|---|
| 5,455,791 A | 10/1995 | Zaleski et al. | 365/185.26 |
| 5,557,231 A | 9/1996 | Yamaguchi et al. | 327/534 |
| 5,608,223 A | 3/1997 | Hirokawa et al. | 250/447.11 |
| 5,646,900 A | 7/1997 | Tsukude et al. | 365/205 |
| 5,753,923 A | 5/1998 | Mera et al. | 250/443.1 |
| 5,844,845 A | 12/1998 | Tahara | 365/189.05 |
| 5,869,872 A | 2/1999 | Asai et al. | 257/360 |
| 5,889,293 A | 3/1999 | Rutten et al. | 257/74 |
| 6,043,536 A | 3/2000 | Numata et al. | 257/347 |
| 6,063,686 A | 5/2000 | Masuda et al. | 438/406 |
| 6,072,217 A | 6/2000 | Burr | 257/351 |
| 6,108,264 A | 8/2000 | Takahashi et al. | 365/230.03 |
| 6,141,269 A | 10/2000 | Shiomi et al. | 365/200 |
| 6,300,218 B1 | 10/2001 | Cohen et al. | 438/423 |
| 6,372,600 B1 | 4/2002 | Desko et al. | 438/406 |
| 6,476,462 B2 | 11/2002 | Shimizu et al. | 257/627 |
| 6,498,057 B1 | 12/2002 | Christensen et al. | 438/149 |
| 6,611,023 B1 | 8/2003 | En et al. | 257/350 |
| 6,825,524 B1 | 11/2004 | Ikehashi et al. | 257/314 |
| 7,020,024 B2 * | 3/2006 | Sim | 365/185.23 |
| 7,109,532 B1 | 9/2006 | Lee et al. | 257/133 |
| 7,112,997 B1 | 9/2006 | Liang et al. | 326/81 |
| 7,447,104 B2 | 11/2008 | Leung | 365/230.06 |
| 7,449,922 B1 | 11/2008 | Ricavy | 327/57 |
| 2001/0038299 A1 | 11/2001 | Afghahi et al. | 326/86 |
| 2001/0047506 A1 | 11/2001 | Houston | 716/4 |
| 2002/0105277 A1 | 8/2002 | Tomita et al. | 315/111.81 |
| 2002/0114191 A1 | 8/2002 | Iwata et al. | 365/185.23 |
| 2002/0185684 A1 | 12/2002 | Campbell et al. | 257/347 |
| 2003/0001658 A1 | 1/2003 | Matsumoto | 327/534 |
| 2004/0108532 A1 | 6/2004 | Forbes | 257/296 |
| 2004/0146701 A1 | 7/2004 | Taguchi | 428/209 |
| 2004/0197970 A1 | 10/2004 | Komatsu | 438/163 |
| 2005/0077566 A1 | 4/2005 | Zheng et al. | 257/315 |
| 2005/0110078 A1 | 5/2005 | Shino | 257/331 |
| 2005/0255666 A1 | 11/2005 | Yang | 438/401 |
| 2005/0276094 A1 | 12/2005 | Yamaoka et al. | 365/154 |
| 2006/0013028 A1 | 1/2006 | Sarin et al. | 365/49 |
| 2006/0013042 A1 | 1/2006 | Forbes et al. | 365/185.08 |
| 2006/0035450 A1 | 2/2006 | Frank et al. | 438/585 |
| 2006/0220085 A1 | 10/2006 | Huo et al. | 257/296 |
| 2006/0226463 A1 | 10/2006 | Forbes | 257/301 |
| 2006/0267064 A1 | 11/2006 | Rosner et al. | 257/304 |
| 2006/0291321 A1 | 12/2006 | Leung | 365/230.06 |
| 2007/0029596 A1 | 2/2007 | Hazama | 257/296 |
| 2007/0029620 A1 | 2/2007 | Nowak | 257/369 |
| 2007/0063284 A1 | 3/2007 | Kawahara et al. | 257/351 |
| 2007/0075366 A1 | 4/2007 | Hamamoto | 257/347 |
| 2007/0076467 A1 | 4/2007 | Yamaoka et al. | 365/154 |
| 2007/0109906 A1 | 5/2007 | Leung | 365/230.06 |
| 2007/0139072 A1 | 6/2007 | Yamaoka et al. | 326/33 |
| 2007/0152736 A1 | 7/2007 | Itoh et al. | 327/534 |
| 2007/0158583 A1 | 7/2007 | Cho | 250/440.11 |
| 2007/0171748 A1 | 7/2007 | Mukhopadhyay et al. | 365/208 |
| 2007/0241388 A1 | 10/2007 | Yamamoto et al. | 257/314 |
| 2007/0298549 A1 | 12/2007 | Jurczak et al. | 438/149 |
| 2008/0042187 A1 | 2/2008 | Hwang | 257/316 |
| 2008/0111199 A1 | 5/2008 | Kim et al. | 257/401 |
| 2008/0116939 A1 | 5/2008 | Takizawa | 326/103 |
| 2008/0144365 A1 | 6/2008 | Yamaoka et al. | 365/181 |
| 2008/0173916 A1 | 7/2008 | Nishihara | 257/296 |
| 2008/0203403 A1 | 8/2008 | Kawahara et al. | 257/80 |
| 2008/0251848 A1 | 10/2008 | Borot et al. | 257/365 |
| 2008/0253159 A1 | 10/2008 | Kajigaya | 365/51 |
| 2009/0003105 A1 | 1/2009 | Itoh et al. | 365/203 |
| 2009/0010056 A1 | 1/2009 | Kuo et al. | 365/184 |
| 2009/0086534 A1 | 4/2009 | Ferrant et al. | 365/154 |
| 2009/0096011 A1 | 4/2009 | Hong et al. | 257/321 |
| 2009/0096036 A1 | 4/2009 | Ishigaki et al. | 257/392 |
| 2009/0101940 A1 | 4/2009 | Barrows et al. | 257/204 |
| 2009/0111223 A1 | 4/2009 | Wiatr et al. | 438/155 |
| 2009/0121269 A1 | 5/2009 | Caillat et al. | 257/301 |
| 2009/0310431 A1 | 12/2009 | Saito | 365/207 |
| 2010/0032761 A1 | 2/2010 | Ding et al. | 257/350 |
| 2010/0035390 A1 | 2/2010 | Ding et al. | 438/152 |
| 2010/0079169 A1 | 4/2010 | Kim et al. | 326/120 |
| 2010/0117684 A1 | 5/2010 | Kim et al. | 326/120 |

FOREIGN PATENT DOCUMENTS

| | | |
|---|---|---|
| EP | 1 199 745 A2 | 4/2002 |
| EP | 1 233 454 A2 | 8/2002 |
| EP | 1 357 603 A2 | 10/2003 |
| EP | 1 744 364 A2 | 1/2007 |
| FR | 2 925 223 A | 6/2009 |
| JP | 4-345064 A | 12/1992 |
| JP | 8-255846 A | 10/1996 |
| JP | 9-232446 A | 9/1997 |
| JP | 10-125064 A | 5/1998 |
| JP | 2000-196089 A | 7/2000 |
| JP | 2003-152192 A | 5/2003 |
| JP | 2004-303499 A | 10/2004 |
| JP | 2006-165808 A | 6/2006 |
| WO | WO 99/66559 A1 | 12/1999 |
| WO | WO 2007/060145 A1 | 5/2007 |
| WO | WO 2008/134688 A1 | 11/2008 |
| WO | WO 2009/013422 A2 | 1/2009 |
| WO | WO 2009/028065 A1 | 3/2009 |
| WO | WO 2009/077538 A2 | 6/2009 |
| WO | WO 2009/085865 A1 | 7/2009 |
| WO | WO 2009/104060 A1 | 8/2009 |
| WO | WO 2010/007478 A1 | 1/2010 |

OTHER PUBLICATIONS

Barth et al., "A 45nm SOI Embedded DRAM Macro for POWER7™ 32MB On-Chip L3 Cache,"ISSCC 2010/Session 19/High-Performance Embedded Memory/19.1, IEEE International Solid-State Circuits Conference, Digest of Technical Papers, pp. 342-344 (Feb. 10, 2010).

Beckett, "Performance Characteristics of a Nanoscale Double-gate Reconfigurable Array," Smart Structures, Devices, and Systems IV, Proceedings of SPIE, 7268:72680E-1-72680E-12 (Dec. 2008).

Cheng et al., "Extremely Thin SOI (ETSOI) CMOS with Record Low Variability for Low Power System-on-Chip Applictions," IEEE International Electron Devices Meeting pp. 3.2.1-3.2.4 (Dec. 2009).

Choi et al., "Improved current drivability with back-gate bias for elevated source and drain structured FD-SOI *SiGe* MOSFET," Microelectronic Engineering, 86(11): 2165-2169 (Nov. 2009).

Hassoune et al., "Double-gate MOSFET based reconfigurable cells," Electronics Letters, 43(23):1273-1274 (Nov. 2007).

Ioannou et al., "Opposite-Channel-Based Injection of Hot-Carriers in SOI MOSFET's: Physics and Applications," IEEE Transactions on Electron Devices, 45(5):1147-1154 (May 1998).

Itoh et al., "Impact of FD-SOI on Deep-Sub-100-nm CMOS LSIs—A View of Memory Designers," IEEE International SOI Conference, 2 pages (Oct. 2006).

Klim et al., "A 1 MB Cache Subsystem Prototype With 1.8 ns. Embedded DRAMs in 45 nm SOI CMOS," IEEE Journal of Solid-State Circuits, 44(4):1216-1226 (Apr. 2009).

Kuhn, "Variation in 45nm and Implications for 32nm and Beyond," Intel, 2009 $2^{nd}$ International CMOS Variability Conference—London, pp. 1-86.

Mizukami et al., "Depletion-type Cell-Transistor of 23 nm Cell Size on Partial SOI Substrate for NAND Flash Memory," Extended Abstracts of the 2009 International Conference on Solid State Devices and Materials, Sendai, Miyagi, Japan, pp. 865-866 (Oct. 2009).

Matsumiya et al., "A 15-ns 16-Mb CMOS SRAM With Interdigitated Bit-Line Architecture," IEEE Journal of Solid-State Circuits, 27(11):1497-1503 (Nov. 1992).

Mukhopadhyay et al., "A Novel High-Performance and Robust Sense Amplifier Using Independent Gate Control in Sub-50-nm Double-Gate MOSFET," IEEE Transactions on Very Large Scale Integration (VLSI) Systems, 14(2):183-192 (Feb. 2006).

Mukhopadhyay et al., "Design of High Performance Sense Amplifier Using Independent Gate Control in Sub-50nm Double-Gate

(56) References Cited

OTHER PUBLICATIONS

MOSFET," Sixth International Symposium on Quality Electronic Design (ISQED 2005), pp. 490-495 (Mar. 2005).
Nasalski et al., "An Innovative sub-32nm SRAM Voltage Sense Amplifier in Double-Gate CMOD Insensitive to Process Variations and Transistor Mismatch," 15$^{th}$ IEEE International Conference on Electronics, Circuits and Systems, pp. 554-557, (Aug.-Sep. 2008).
Nasalski et al., "SRAM Voltage and Current Sense Amplifiers in sub-32nm Double-Gate CMOS Insensitive to Process Variations and Transistor Mismatch," IEEE International Circuits and Systems, pp. 3170-3173 (May 2009).
Ohtou et al., "Threshold-Voltage Control of AC Performance Degradation-Free FD SOI MOSFET With Extremely Thin BOX Using Variable Body-Factor Scheme," IEEE Transactions on Electron Devices, 54(2):301-307 (Feb. 2007).
Roy et al., "Double-Gate SOI Devices for Low-Power and High-Performance Applications," Proceedings of the 2005 IEEE/ACM International Conference on Computer-Aided Design, pp. 217-224 (Nov. 2005).
Tsuchiya et al., "Silicon on Thin BOX: A New Paradigm of the CMOSFET for Low-Power and High-Performance Application Featuring Wide-Range Back-Bias Control," IEDM Technical Digest. IEEE International Electron Devices Meeting, pp. 631-634 (Dec. 2004).
Tsuchiya et al., "Controllable Inverter Delay and Suppressing $V_{th}$ Fluctuation Technology in Silicon on Thin BOX Featuring Dual Back-Gate Bias Architecture," IEEE International Electron Devices Meeting, pp. 475-478 (Dec. 2007).
Wilhelmus A. M. Van Noije, et al., "Advanced CMOS Gate Array Architecture Combining "Gate Isolation," and Programmable Routing Channels," IEEE Journal of Solid-State Circuits, 20(2):469-480 (Apr. 1985).

Yamaoka, et al., "SRAM Circuit With Expanded Operating Margin and Reduced Stand-By Leakage Current Using Thin-Box FD-SOI Transistors," IEEE Journal of Solid-State Circuits, 41(11):2366-2372 (Nov. 2006).
Yamaoka et al., "Dynamic-Vt, Dual-Power-Supply SRAM Cell using D2G-SOI for Low-Power SoC Application," IEEE International SOI Conference, pp. 109-111 (Oct. 2004).
Ulicki et al., "De-Myth-tifying the SOI Floating Body Effect," SOI Industry Consortium, pp. 2-7 (Sep. 2009).
European Search Report, Application No. EP 10290217 dated Sep. 15, 2010.
European Search Report, Application No. EP 10290181.6 dated Jan. 6, 2011.
European Search Report, Application No. EP 09290838.3 dated Feb. 16, 2010.
U.S. Appl. No. 12/789,100, filed May 27, 2010.
U.S. Appl. No. 12/793,515, filed Jun. 3, 2010.
U.S. Appl. No. 12/880,806, filed Sep. 13, 2010.
U.S. Appl. No. 12/886,421, filed Sep. 20, 2010.
U.S. Appl. No. 12/898,230, filed Oct. 5, 2010.
U.S. Appl. No. 12/942,754, filed Nov. 9, 2010.
U.S. Appl. No. 12/946,135, filed Nov. 15, 2010.
U.S. Appl. No. 12/961,293, filed Dec. 6, 2010.
U.S. Appl. No. 12/974,822, filed Dec. 21, 2010.
U.S. Appl. No. 12/974,916, filed Dec. 21, 2010.
U.S. Appl. No. 12/984,466, filed Jan. 4, 2011.
U.S. Appl. No. 13/007,483, filed Jan. 14, 2011.
U.S. Appl. No. 13/013,580, filed Jan. 25, 2011.
U.S. Appl. No. 13/039,167, filed Mar. 2, 2011.

\* cited by examiner

PSEUDO-INVERTER CIRCUIT ON SEOI

CROSS-REFERENCE TO RELATED APPLICATIONS

This application is a continuation of application Ser. No. 12/793,553 filed Jun. 3, 2010.

FIELD OF THE INVENTION

The field of the invention is that of semiconductor devices made on a semiconductor-on-insulator substrate (SeOI substrate) comprising a thin layer of semiconducting material separated from a base substrate by an insulating layer.

The invention more specifically relates to a pseudo-inverter SeOI circuit which, depending on the inputs which are applied to it, may provide the logic INV (inversion), NOR and NAND functions, so that the whole of the standard library of CMOS cells may be described on the basis of a single circuit of the invention.

A preferential application of the invention relates to the making of a wordline driver circuit for a network of memory cells.

BACKGROUND OF THE INVENTION

A conventional DRAM (Dynamic Random Access Memory) memory cell is formed by associating a transistor and a capacitance for storing charges. More recently, a DRAM memory cell only consisting of one transistor has been proposed. This cell utilizes a floating channel effect for storing charges and does not require any additional capacitance.

Memory cells are conventionally laid out in a memory array so that the gates of the transistors of the cells laid out along a line of the memory array share a wordline, while the sources of the transistors of the cells laid out along a column of the memory array share a bitline. The stored datum in a memory cell may be accessed by means of a single row address represented by the wordline and of a single column address represented by the bitline.

Each wordline is controlled via a wordline driver circuit, which is itself driven by a row address decoder.

In practice, the access transistor in the DRAM memory cell must have a very low leakage to sustain the information as long as possible. Its threshold voltage should thus be relatively high. This implies that a relatively large voltage has to be applied on the gate in order to make it conducting. It will be noted that the voltage of the wordline should also take into account the source-dependent change in the threshold voltage of the transistor of the memory cell known as "body effect". The wordline driving the gate of the transistor should thus deliver a voltage which is typically 1.5 to 2 times higher than the nominal voltage.

Conventional wordline driver circuits are thus relatively bulky notably relatively to the size of a memory cell, which generally causes integration problems (notably the requirement for resorting to a stacking technique, a so-called "staggering" technique, for several driver circuits behind each other in order to address several adjacent lines of memory cells).

In FIG. 1, a wordline driver circuit 300 according to the state of the art is illustrated, as described in US patent application 2007/0109906.

The driver circuit 300 addresses a line of memory cells 100 via the wordline WL. All the nodes of the circuit 300 have a high voltage, except for the input signals Yi and Yi# from the line address decoder 330. The transistors of the driver circuit 300 thus have to support high voltages, notably the transistors 303 and 313.

By taking into account the different interconnections, the Applicant was able to estimate that the area of the driver circuit 300 of FIG. 1 corresponds to about 6 times that of transistor 303. Circuit 300 therefore proves to be particularly area consuming, notably as compared with the area of a memory cell formed with a single transistor.

The staggering of several driver circuits 300 behind each other then proves to be necessary in order to take into account the pitch difference.

A simpler wordline driver circuit is illustrated in FIGS. 2a and 2b. FIG. 2a illustrates the logic functions provided by this circuit, while FIG. 2b illustrates a possible embodiment thereof.

It will first of all be noted that this circuit includes two logic NOR gates 2, 3 in parallel, having a common input MWL# and having as another input, a single signal A or its complementary A#. The outputs are formed by local wordlines $LWL_E$ and $LWL_O$.

It will then be noted that unlike the circuit of FIG. 1, the circuit of FIGS. 2a and 2b is supplied with a high voltage main wordline signal MWL# provided by a line address decoder 1. The result is more (about two to four times more) significant power consumption than for the circuit of FIG. 1.

An estimation made by the Applicant of the size of each of the transistors relatively to the reference $W_{303}$ designating the width of the transistor 303 of FIG. 1 is reported on FIG. 2b. The result is that the total size is of the order of 6 $W_{303}$. Thus, the circuit of FIGS. 2a and 2b proves to be actually simpler than that of FIG. 1, nevertheless it remains area consuming.

SUMMARY OF THE INVENTION

The invention now proposes a circuit which does not have the drawbacks mentioned earlier, in particular that it is a relatively compact, not very bulky, low consumption circuit, which may be used as a wordline driver circuit in a memory array.

The invention also proposes a particularly simple, compact and not very bulky circuit which may be used for providing different logic functions.

In this context, the invention relates to a circuit made on a semiconductor-on-insulator substrate comprising a thin layer of semiconducting material separated from a base substrate by an insulating layer. This circuit comprises a first transistor having a first channel, a second transistor having a second channel, with the transistors provided in serial association between first and second terminals for applying a power supply potential, each of the transistors comprising a drain region and a source region in the thin layer, a channel extending between the source region and the drain region, and a front control gate located above the channel. Each transistor has a back control gate formed in the base substrate below the channel of the transistor and capable of being biased in order to modulate the threshold voltage of the transistor. Advantageously, at least one of the transistors is configured for operating in a depletion mode under the action of a back gate signal which will sufficiently modulate its threshold voltage.

Preferably, the first terminal for application of a power supply potential is biased by the complementary signal of the back gate signal, whereas the second terminal for application of a power supply potential is biased at an OFF state, while the second transistor is configured in order to operate in a depletion mode when the back gate signal is in an ON state.

Another embodiment of the invention includes a wordline driver circuit comprising at least one pair of circuits as defined herein and laid out in parallel, each circuit of the pair being intended to receive an input signal from a row address decoder and providing at the output a signal intended to be used as a local wordline for a plurality of memory cells laid out as a row.

A further embodiment of the invention is a memory incorporating a wordline driver circuit as disclosed herein.

Finally, a further embodiment of the invention is a method for controlling a driver circuit as disclosed herein, wherein in the active mode, the signal for biasing the back gates of the first circuit of a pair of circuits is complementary of the signal for biasing the back gates of the second circuit of the pair of circuits; and in the inactive mode, the first terminal for application of a power supply potential and the signals for biasing the back gates of each of the circuits of the pair are in the OFF state.

BRIEF DESCRIPTION OF THE DRAWINGS

Other aspects and advantages of the present invention will become better apparent upon reading the following detailed description of preferred embodiments thereof, given as a non-limiting example, and made with reference to the appended drawings wherein.

DETAILED DESCRIPTION OF THE INVENTION

Figure 1:
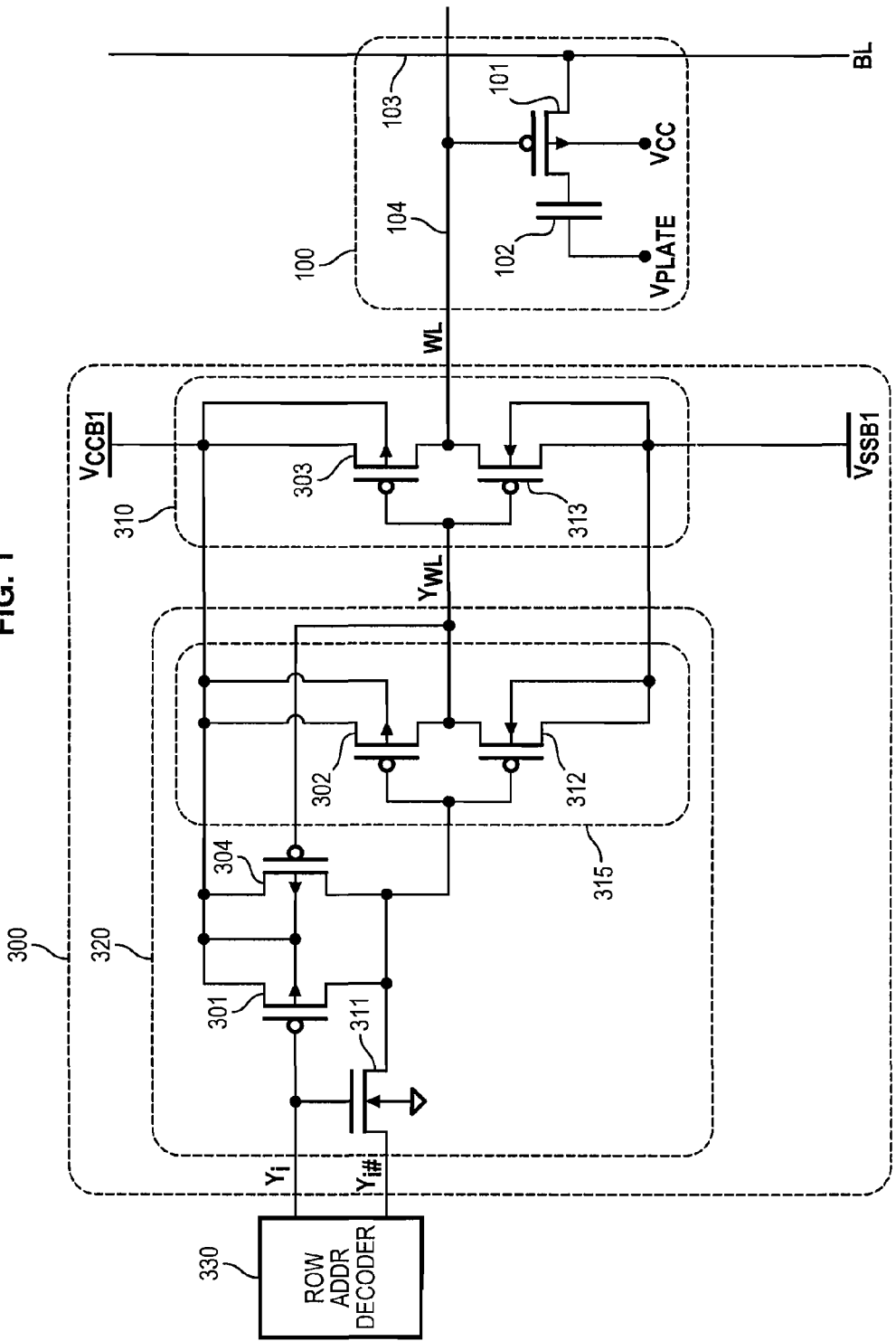
FIGS. 1, 2a, and 2b illustrate wordline driver circuits according to the prior art.

According to a first aspect, provides a circuit made on a semiconductor-on-insulator substrate comprising a thin layer of semiconducting material separated from a base substrate by an insulating layer, including a transistor of a first type of channel in series with a transistor of a second type of channel between a first and a second terminals for application of a power supply potential, each of the transistors comprising a drain region and a source region in the thin layer, a channel extending between the source region and the drain region and a front control gate located above the channel. Each transistor advantageously has a back control gate formed in the base substrate below the channel of the transistor and capable of being biased for modulating the threshold voltage of the transistor. Also, at least one of the transistors is configured in order to operate in a depletion mode under the action of a back gate signal which will sufficiently modulate its threshold voltage.

Certain preferred but non-limiting aspects of this device include the following:
the back control gates are biased by a same back gate signal;
the first terminal for application of a power supply potential is biased by the complementary signal of said back gate signal, whereas the second terminal for application of a power supply potential is biased at a "OFF" state;
the transistor of the second type of channel is configured in order to operate in a depletion mode when the back gate signal is in the "ON" state;
the second terminal for application of a power supply potential is biased by a complementary signal of said back gate signal, whereas the first terminal for application of a power supply potential is biased to a "ON" state;
the transistor of the first type of channel is configured so as to operate in a depletion mode when the back gate signal is in the "OFF" state;
the first terminal for application of a power supply potential is biased at an ON state, whereas the second terminal for application of a power supply potential is biased at an "OFF" state;
the device includes an input node connected to the front control gate of each of the transistors, and an output node connected to the middle point of the serial association of the transistors;
the transistor of the first channel type is a PFET transistor and wherein the transistor of the second channel type is an NFET transistor; and
the transistors are fully depleted SeOI transistors.

According to a second aspect, the invention relates to a wordline driver circuit comprising at least one pair of circuits according to the first aspect of the invention, laid out in parallel, each circuit of the pair being intended to receive an input signal from a row address decoder and providing at the output a signal intended to be used as a local wordline for a plurality of memory cells laid out as a row.

According to still another aspect, the invention relates to a memory incorporating a wordline driver circuit according to the second aspect of the invention.

According to still another aspect, the invention relates to a method for controlling a driver circuit according to the second aspect of the invention, wherein in an active mode, the signal for biasing the back gates of the first circuit of a pair of circuits is the complementary signal of the signal for biasing the back gates of the second circuit of the pair of circuits; while in an inactive mode, the first terminal for application of a power supply potential and the signals for biasing the back gates of each of the circuits of a pair are in the "OFF" state.

The invention according to a preferred aspect relates to a circuit made on a semiconductor-on-insulator substrate comprising a thin layer of semiconducting material separated from a base substrate by an insulating layer.

The circuit includes a transistor of a first channel type in series with a transistor of a second channel type between a first and a second terminals for application of a power supply potential, each of the transistors comprising a drain region and a source region in the thin layer, a channel extending between the source region and the drain region, and a front control gate located above the channel.

Figure 5:
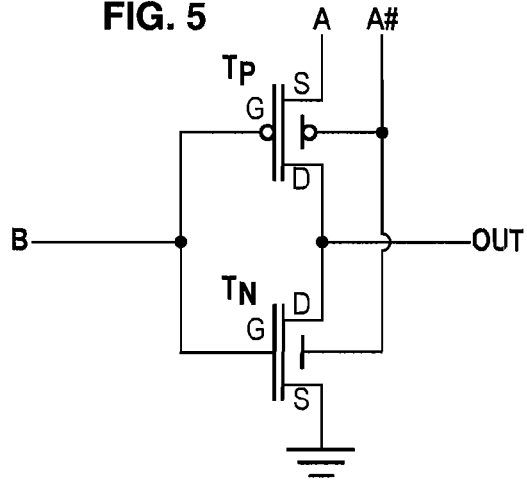
FIG. 5 illustrates a possible embodiment of the circuit according to the first aspect of the invention providing the logic NOR function.
Figure 6:
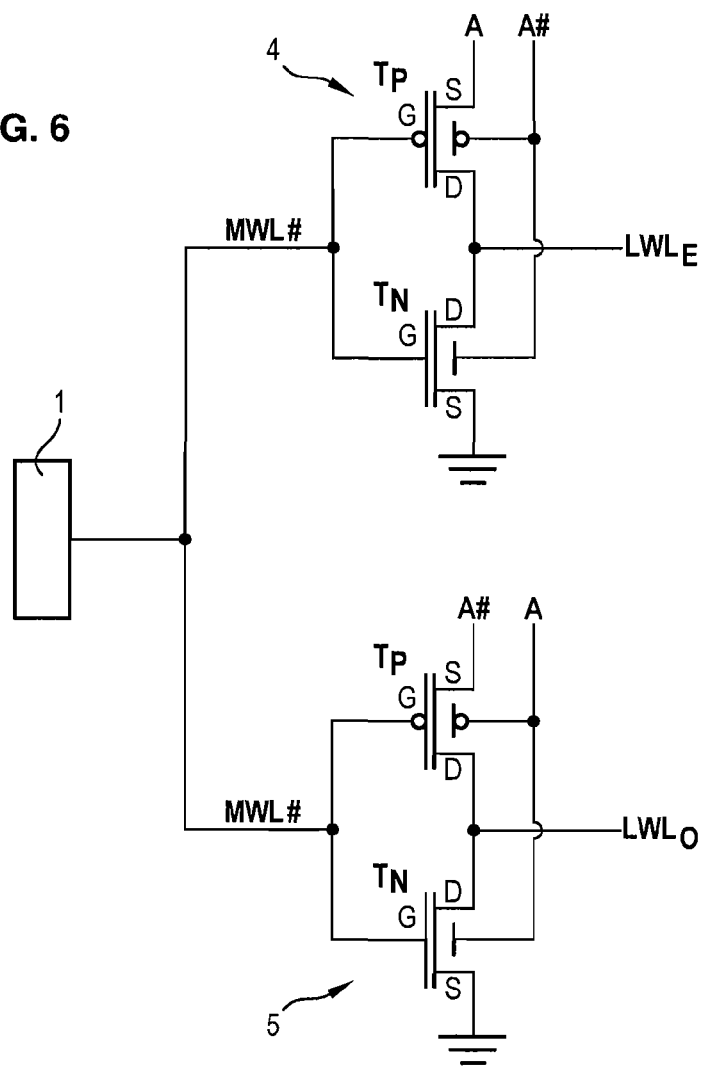
FIG. 6 illustrates a possible embodiment of a wordline driver circuit according to the second aspect of the invention.
Figure 7:
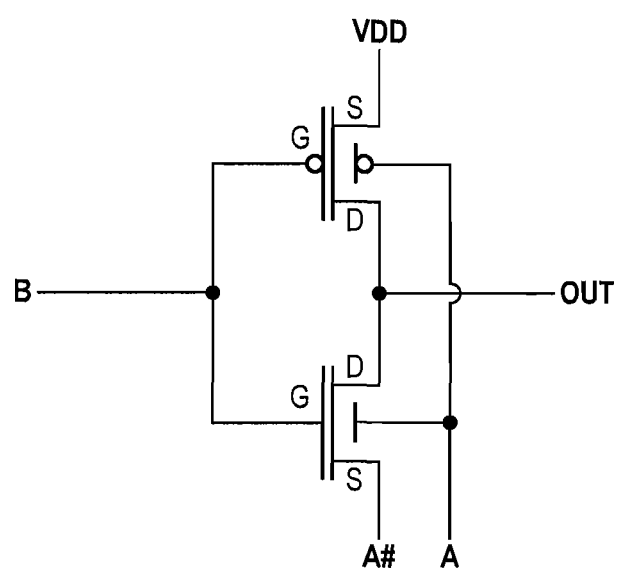
FIG. 7 illustrates a possible embodiment of the circuit according to the first aspect of the invention providing the logic NAND function.

In the embodiment illustrated in FIGS. 5-7, the circuit comprises a P channel transistor $T_P$, the source of which is connected to the first terminal for application of a power supply potential and an N channel transistor $T_N$, the source of which is connected to the second terminal for application of a power supply potential.

The gates of the transistors $T_P$, $T_N$ of the circuit are connected together and connected to a common input (B in FIGS. 5 and 7, MWL# in FIG. 6). The middle point of the serial association of the transistors $T_P$, $T_N$ forms the output of the circuit (OUT in FIGS. 5 and 7, $LWL_E$ and $LWL_O$ in FIG. 6).

The circuit according to the first aspect of the invention is said to be a pseudo-inverter in that it has the standard structure of a CMOS inverter. However, as this will be described further subsequently, depending on the inputs which are applied on this circuit, the latter may produce other logic functions.

It will be noted that the logic inversion function may moreover be achieved by setting in a standard way the first terminal for application of a power supply potential to the high state VDD and by setting the second terminal for application of a power supply potential to the low state GND.

Within the scope of the invention, each of the transistors has a back control gate formed in the base substrate below the channel and capable of being biased for modulating the threshold voltage of the transistor.

Figure 3A:
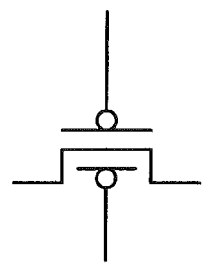
FIGS. 3a and 3b illustrate examples of transistors having a back control gate.
Figure 3A:
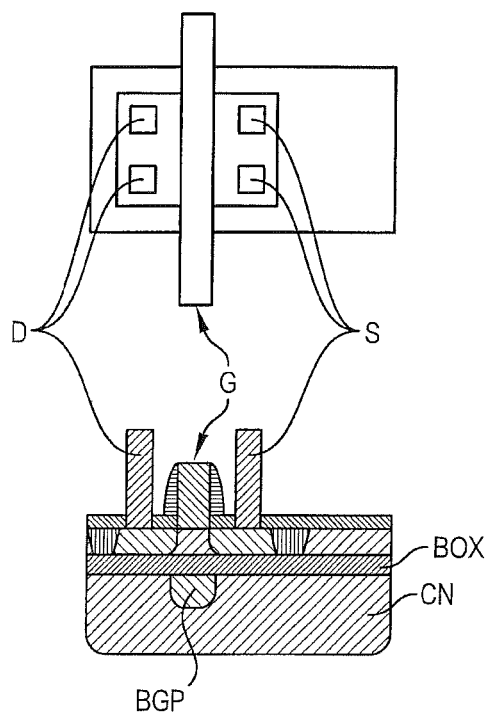

A P channel transistor is illustrated in FIG. 3a, having a back control gate $BG_P$ laid out in the base substrate under the insulating layer BOX so as to be positioned facing the front control gate G. The back control gate $BG_P$ is formed here by a P type doped region isolated from the base substrate by a well $C_N$ of conductivity N.

Figure 3B:
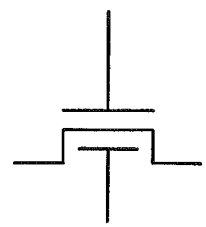
Figure 3B:
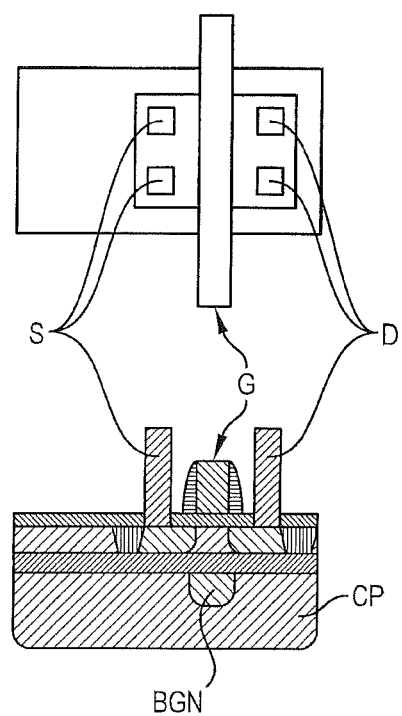

An N channel transistor is illustrated in FIG. 3b, having a back control gate $BG_N$ laid out in the base substrate under the insulating layer so as to be positioned facing the front control gate G. The back control gate $BG_N$ is formed here by an N type doped region insulated from the base substrate by a well $C_P$ of conductivity P.

In FIGS. 3a and 3b, the transistors are fully depleted SeOI transistors defined by a channel/body region that is thin enough to allow the field induced by the top control gate (under usual voltage conditions) to reach the buried oxide layer (BOX).

A transistor for which the channel has N type conductivity and a back control gate of conductivity P has a very high threshold voltage. This threshold voltage may then be reduced by applying a positive voltage on the back control gate. A transistor for which the channel has N type conductivity and a back control gate of conductivity N, as for it, has a nominal threshold voltage which may be reduced by applying a positive voltage on the back control gate.

This variation of the threshold voltage of the transistor via the back control gate may be formulated as $V_{th}=V_{t0}-\alpha \cdot V_{BG}$, wherein $V_{th}$ represents the threshold voltage of the transistor, $V_{BG}$ the voltage applied to the back control gate, $V_{t0}$ the nominal threshold voltage (which may be shifted by the work function depending on whether a back control gate of the N or P type is used), and $\alpha$ is a coefficient related to the geometry of the transistor.

As shown in the thesis "Architectures innovantes de mémoire non-volatile embarquée sur film mince de silicium" (Innovating architectures of non-volatile memory embedded on a thin film of silicon) defended by Germain Bossu in June 2009 at the University of Provence Aix Marseille I, the coefficient $\alpha$ may notably be approached as $$\alpha = \frac{3 \cdot t_{ox}}{t_{Si} + 3 \cdot t_{BOX}},$$

wherein $t_{ox}$ designates the thickness of the dielectric gate layer separating the front control gate from the channel, $t_{BOX}$ designating the thickness of the insulating layer separating the back control gate from the channel and $t_{Si}$ designating the thickness of the thin layer.

It is therefore understood that the type of doping of the back control gate associated with a transistor either shifts the nominal threshold voltage or not, and that the bias of the back control gate allows adjustment of the threshold voltage.

Figure 4:
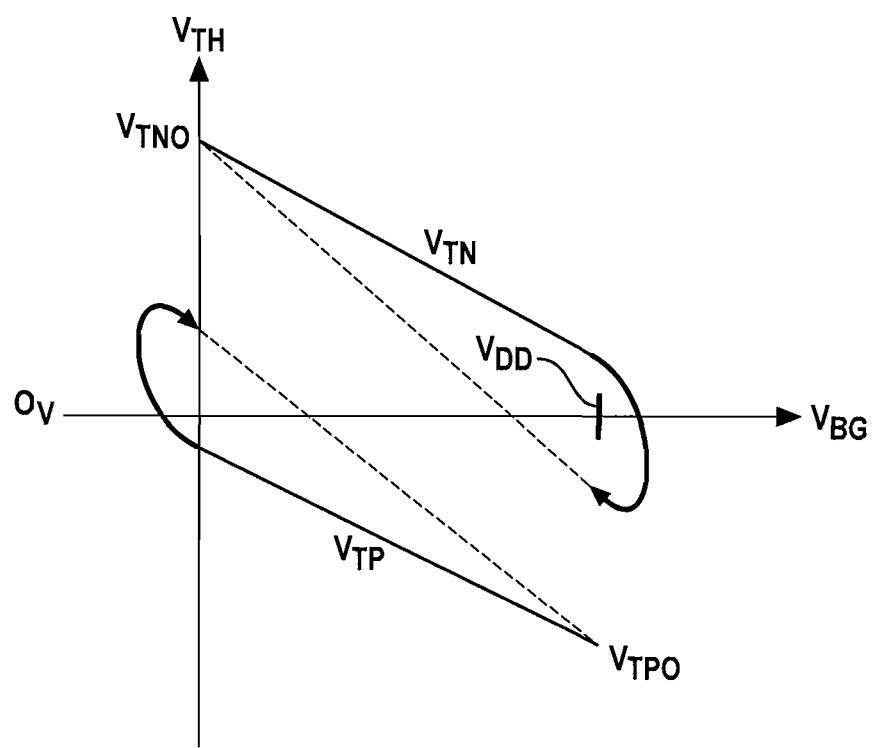
FIG. 4 illustrates the modulation of the threshold voltage of a transistor depending on the bias of its back control gate.

In this respect, FIG. 4 illustrates the modulation of the threshold voltage $V_{TH}$ of a transistor depending on the bias $V_{BG}$ of its back control gate. This bias is typically in the range 0V-VDD.

An N type transistor has a nominal threshold voltage $V_{TN0}$. The effective threshold voltage of this transistor may be reduced from the nominal threshold voltage $V_{TN0}$ by increasing the bias $V_{BG}$ of its back control gate, and this globally linearly according to a slope corresponding to the coefficient $\alpha$ related to the geometry of the transistor.

Two possible variations of the threshold voltage of an N channel transistor versus the geometry coefficient $\alpha$ are illustrated in FIG. 4, in solid lines and in dotted lines, respectively. It is noticed that it proves to be possible (cf. dotted line curve) to adopt a geometry of a transistor such that the transistor is in a depletion mode (negative threshold voltage) when a sufficiently large bias is applied to its back control gate.

A P type transistor has a nominal threshold voltage $V_{TP0}$. The effective threshold voltage of this transistor may be increased from the nominal threshold voltage $V_{TP0}$ by reducing the bias $V_{BG}$ of its back control gate, and this globally linearly according to a slope corresponding to the coefficient $\alpha$ related to the geometry of the transistor.

Two possible variations of the threshold voltage of a P channel transistor versus the geometry coefficient $\alpha$ are illustrated in FIG. 4, in solid lines and in dotted lines, respectively. It is noticed that it proves to be possible (cf. doted line curve) to adopt a geometry of a transistor such that the transistor is in a depletion mode (positive threshold voltage) when a sufficiently low bias is applied to its back control gate.

Preferentially, provision is made for the transistors of the circuit according to the first aspect of the invention to be fully depleted. The benefit is thus due to the fact that such transistors have very low fluctuation of dopants (RDF: Random Dopant Fluctuation): the nominal threshold voltage is then defined very specifically, as well as the variation of the threshold voltage versus bias of the back control gate.

Referring back to the description of the invention, it is provided that at least one of the transistors of the circuit is configured so as to operate in a depletion mode under the action of a back gate signal which will sufficiently modulate its threshold voltage.

It may also be advantageously provided that the back control gates of the transistors $T_P$ and $T_N$ are biased by a same back gate signal (possibly with a modification of the amplitude of the back gate signal).

It will be noted at this stage that depending on the contemplated applications, transistors may be selected for which the nominal threshold voltages ($V_{TN0}$ and $V_{TP0}$) are not identical (in absolute value), so that only one of the two transistors of the circuit is capable of operating in a depletion mode. Alternatively, a back gate signal which does not have the same amplitude may also be applied to the back control gate of each of the transistors $T_P$ and $T_N$.

According to a first possible embodiment of the circuit according to the first aspect of the invention illustrated in FIG. 5, the pseudo-inverter circuit provides the logic NOR function.

In FIG. 5, the back control gates are biased by a same back gate signal A#. The first terminal for application of a power supply potential is biased by the complementary signal A of the back gate signal, while the second terminal for application of a power supply potential is biased at a OFF state (low state GND). The transistor of the second channel type $T_N$, as for it, is configured so as to operate in a depletion mode when the back gate signal A# is at the ON state (high state H).

It will be noted that within the claims, the term "ON state" is preferred to "high state" and the term "OFF state" is preferred to "low state" as the concept high/low is fine for the N-channel transistor but inverted for the Pchannel transistor.

Hence ON means that the transistor is boosted and leaky. It can even be depletion if there is enough amplitude in threshold voltage modulation. OFF means that the threshold voltage of the transistor is elevated by the back gate control: the transistor has less leakage and less drive. The voltage effects by the back control gate are symmetrical for P and N channels.

The operation of the circuit of FIG. 5 is the following, depending on the high H or low L state of inputs A and B.

B=H and A=H

When the input B of the pseudo-inverter circuit is in the high state, the transistor $T_N$ is conducting while the transistor $T_P$ is blocked.

As the signal A applied to the first terminal for application of a power supply potential is high, the circuit is powered.

The complementary signal A# applied to the back gates is such that the transistor $T_P$ remains in an enhancement mode and is therefore blocked.

Alternatively, a transistor geometry (via the parameters $t_{ox}$, $t_{BOX}$ and $t_{Si}$) may be adopted such that $T_P$ is in an enhancement mode when A#=0V. This alternative should of course be compatible with the properties that the transistor $T_N$ should have in the other cases.

The OUT output of the circuit is then in the low state.

B=H and A=L

As the input B of the pseudo-inverter circuit is in the high state, the transistor $T_N$ is conducting while the transistor $T_P$ is blocked.

As the signal A applied to the first terminal for application of a power supply potential is (sufficiently) low, the circuit is not powered.

As the back gate signal A# is in the high state, the transistor $T_P$ is blocked and has very low leakage current $I_{OFF}$.

As the back gate signal A# is in the high state, the transistor $T_N$ has a strong conduction current and therefore perfectly maintains a low state on the output OUT of the circuit.

B=L and A=H

As the input B of the pseudo-inverter circuit is in the low state, the transistor $T_N$ is blocked while the transistor $T_P$ is conducting.

As the signal A applied to the first terminal for application of a power supply potential is high, the circuit is powered.

The complementary signal A# applied to the back control gates is such that the transistor $T_P$ remains in an enhancement mode and is therefore conducting with strong conduction current. A high state is therefore perfectly maintained on the output OUT of the circuit.

B=L and A=L

As the input B of the pseudo-inverter circuit is in the low state, the transistor $T_N$ is blocked while the transistor $T_P$ is conducting.

As the signal A applied to the first terminal for application of a power supply potential is (sufficiently low), the circuit is not powered.

As the back gate signal A# is in the high state, the transistor $T_P$ is blocked and has very low leakage current $I_{OFF}$. The transistor $T_N$, as for it, has very good conduction current and remains conducting insofar that the combination of the parameters $t_{ox}$, $t_{BOX}$ and $T_{Si}$ is such that the transistor then operates in a depletion mode. The OUT output of the circuit is then in the low state.

The truth table of the circuit of FIG. 5 is then the following.

| B | A | A# | OUT |
|---|---|----|----|
| H | H | L  | L  |
| H | L | H  | L  |
| L | H | L  | H  |
| L | L | H  | L  |

It will be noted that the signals A and B respectively act on back control and front control gates for which the oxide thicknesses separating them from the channel of the transistor are not the same (the thickness of the buried insulating BOX layer being typically larger than the dielectric gate layer separating the front control gate from the channel). Consequently, the inputs A and B are not equivalent: A is a slow input while B is a relatively fast input.

Figure 2A:
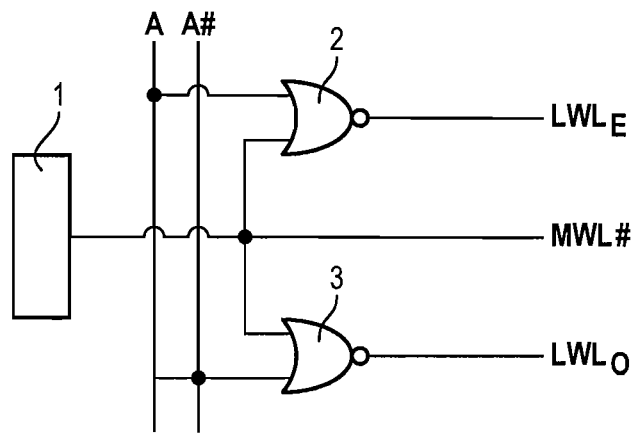
Figure 2B:
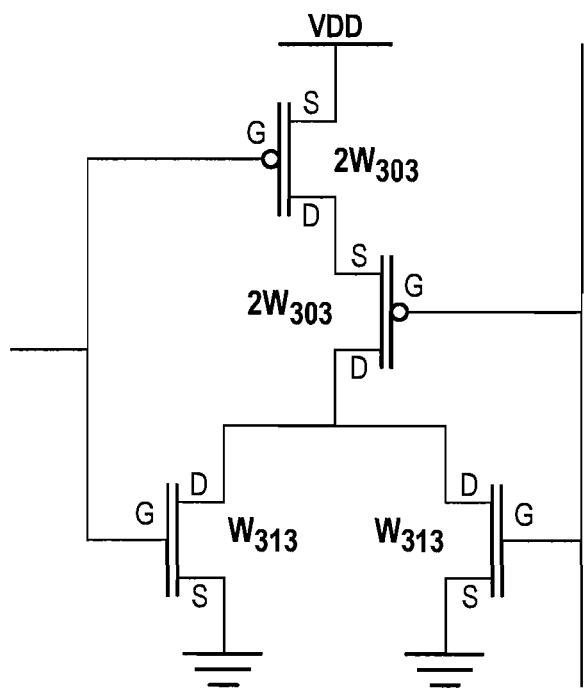

A possible application of the NOR circuit of FIG. 5 which fulfils the same logic function as the circuit of FIG. 2a, is illustrated in FIG. 6, i.e. the embodiment of two NOR gates in parallel.

In this application, a wordline driver circuit of a memory array is provided comprising at least one pair of circuits 4, 5 according to FIG. 5 laid out in parallel, each circuit of the pair being intended for receiving an input signal (main wordline signal MWL#) from a row address decoder 1 and providing at the output a signal $LWL_E$, $LWL_O$ intended to be used as a local wordline for a plurality of memory cells laid out as a line.

The control of the driver circuit illustrated in FIG. 6 is the following.

In an active mode, the back gate bias signal A# of the first circuit 4 of the pair of circuits is the complementary signal of the back gate signal A of the second circuit 5 of the pair of circuits.

In such a way that when the main wordline signal MWL# is in the high state, the first and second circuits 4, 5 both provide a low state at the output ($LWL_E$=$LWL_O$=L). On the other hand, when the main wordline signal MWL# is in the low state, the first circuit 4 provides a high state ($LWL_E$=H), whereas the second circuit 5 provides a low state ($LWL_O$=L).

In an inactive mode (standby mode), the first terminal for application of a power supply potential and the bias signals of back gates of each of the circuits of the pair are in the low state.

In the inactive mode, the main wordline signal MWL# is in the high state. The transistors $T_N$ of the circuits 4, 5 are conducting whereas the transistors $T_P$ of the circuits 4, 5 are blocked.

Insofar that the first terminal for application of a power supply potential and the bias signals of the back gates of each of the circuits of the pair are in the low state, the driver circuit is not powered and therefore no leakages are observed. The outputs (local wordlines $LWL_E$ and $LWL_O$) are therefore both in the low state.

The truth table of the driver circuit of FIG. 6 is thus the following.

|              | MWL# | A | A# | $LWL_E$ | $LWL_O$ |
|--------------|------|---|----|---------|---------|
| Active mode  | H    | H | L  | L       | L       |
|              | H    | L | H  | L       | L       |
|              | L    | H | L  | H       | L       |
|              | L    | L | H  | L       | H       |
| Standby mode | H    | L | L  | L       | L       |

The wordline driver circuit of FIG. 6 has the advantage of low power consumption. Indeed, in the standby mode, the driver circuit is not powered. Moreover, the driver circuit comprises a reduced number of components (only two transistors) so that in the active mode, switching is only observed for a reduced number of components.

According to a second possible embodiment of the circuit according to the first aspect of the invention illustrated in FIG. 7, the pseudo-inverter circuit provides the logic NAND function.

In FIG. 7, the back control gates are biased by a same back gate signal A. The first terminal for application of a power supply potential is biased at a high state VDD, whereas the second terminal for application of a power supply potential is biased by the complementary signal A# of the back gate signal. The transistor of the first channel type $T_P$ is, as for it, configured so as to operate in a depletion mode when the back gate signal A is in the low state L.

The operation of the circuit of FIG. 5 is the following depending on the high H or low L state of the inputs A and B.

B=L and A=L

The transistor $T_P$ is conducting and has strong conduction current because the back gate signal is in the low state.

The transistor $T_N$ is blocked and has few leakages (a weak leakage current because of the back gate signal in the low state). In any case, it is not powered.

The output OUT is thus in the high state.

B=H and A=L

The transistor $T_N$ is blocked and has few leakages (a weak leakage current because of the back gate signal in the low state). In any case, it is not powered.

The transistor $T_P$ is conducting insofar that it then operates in a depletion mode under the action of the bias signal of the back gate in the low state.

The output OUT is thus in the high state.

B=L and A=H

The transistor $T_P$ is conducting (but not boosted because of the high state applied to the back gate signal).

The transistor $T_N$ is blocked (it is not in a depletion mode here)

The output OUT is thus in the high state.

B=H and A=H

The transistor $T_P$ is blocked (and not boosted because of the high state applied to the back gate signal).

The transistor $T_N$ is conducting (it is not in a depletion mode here)

The output OUT is thus in the low state.

The truth table of circuit of FIG. 7 is thus the following.

| B | A | A# | OUT |
|---|---|----|-----|
| L | L | H | H |
| H | L | H | L |
| L | H | L | L |
| H | H | L | L |

Within the scope of the invention, the transistors $T_N$ and $T_P$ may be boosted (increase in their conduction current) when this is desired because of the bias of their back control gate.

Taking the example of the driver circuit of FIG. 6, the relatively large voltage required on the local wordline may be obtained by using transistors which globally are twice as smaller as those used in standard driver solutions.

Thus, the size of the transistor $T_P$ is of the order of one third of that of the transistor 303 of FIG. 1, whereas the size of the transistor $T_N$ is of the order of one third of that of the transistor 313 of FIG. 1 (which is approximately the same as that of the transistor 303).

Thus, the driver circuit has a size globally equal to the size (W303) of the transistor 303

The solution proposed by the invention is thus much denser (by a factor of the order of four taking into account limitations relating to metallization) than those of standard driver solutions.

As indicated earlier, consumption is also reduced.

The integration of such a circuit is further simpler to apply. It does not require resorting to stacking (staggering) and facilitates the introduction of $4F^2$ surface area memory cells by simplifying the peripheral components.

Further, an advantage of the invention is to make available a circuit which, depending on the inputs which are applied to it, may both provide logic INV, NOR and NAND functions, so that the whole of the standard library of CMOS cells may be described on the basis of the single circuit of the invention.

As mentioned earlier, the inputs are not equivalent, in terms of speed notably, but such a circuit may prove to be very interesting in identified contexts, such as for example for decoding circuits, or driver circuits.

What is claimed is:

1. A circuit made on a semiconductor-on-insulator substrate comprising a thin layer of semiconducting material separated from a base substrate by an insulating layer that extends through the entire substrate; the circuit comprising:
    a first transistor having a first channel, a second transistor having a second channel, with the transistors provided in serial association between first and second terminals for applying a power supply potential, each of the transistors comprising a drain region and a source region in the thin layer, a channel extending between the source region and the drain region, and a front control gate located above the channel,
    wherein each transistor has a back control gate formed in the base substrate below the channel of the transistor and capable of being biased in order to modulate the threshold voltage of the transistor, and
    wherein at least one of the transistors is configured for operating in a depletion mode under the action of a back gate signal which will sufficiently modulate its threshold voltage.

2. The circuit according to claim 1, wherein each transistor has a separate back control gate formed in the base substrate that also underlies the insulating layer.

3. The circuit according to claim 1, wherein the back control gates are biased by a same back gate signal.

4. The circuit according to claim 3, wherein the first terminal for application of a power supply potential is biased by the complementary signal of the back gate signal, whereas the second terminal for application of a power supply potential is biased at an OFF state.

5. The circuit according to claim 4, wherein the second transistor is configured in order to operate in a depletion mode when the back gate signal is in an ON state.

6. The circuit according to claim 3, wherein the second terminal for application of a power supply potential is biased by the complementary signal of the back gate signal, while the first terminal for application of a power supply potential is biased to an ON state.

7. The circuit according to claim 6, wherein the first transistor is configured in order to operate in a depletion mode when the back gate signal is in an OFF state.

8. The circuit according to claim 1, wherein the first terminal for application of a power supply potential is biased at an ON state, whereas the second terminal for application of a power supply potential is biased at an OFF state.

9. The circuit according to claim 1, wherein the first and second transistors each have a front control gate and which further comprises an input node connected to the front control gate of each transistor and an output node connected to a middle point of the serial association of the transistors.

10. The circuit according to claim 1, wherein the first transistor is a PFET transistor and wherein the second transistor is a NFET transistor.

11. The circuit according to claim 1, wherein the transistors are fully depleted.

12. A wordline driver circuit comprising at least one pair of circuits according to claim 1 laid out in parallel, each circuit of the pair being intended to receive an input signal from a row address decoder and providing at the output a signal intended to be used as a local wordline for a plurality of memory cells laid out as a row.

13. A memory incorporating a wordline driver circuit according to claim 12.

14. A method for controlling a driver circuit according to claim 12, wherein:
- in the active mode, the signal for biasing the back gates of the first circuit of a pair of circuits is complementary of the signal for biasing the back gates of the second circuit of the pair of circuits; and
- in the inactive mode, the first terminal for application of a power supply potential and the signals for biasing the back gates of each of the circuits of the pair are in the OFF state.

* * * * *